(12) United States Patent
Leitgeb et al.

(10) Patent No.: US 11,069,622 B2
(45) Date of Patent: Jul. 20, 2021

(54) INTERPOSER-TYPE COMPONENT CARRIER AND METHOD OF MANUFACTURING THE SAME

(71) Applicant: AT&S Austria Technologie & Systemtechnik Aktiengesellschaft, Leoben (AT)

(72) Inventors: Markus Leitgeb, Trofaiach (AT); Gerhard Freydl, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/362,380

(22) Filed: Mar. 22, 2019

(65) Prior Publication Data

US 2020/0303313 A1 Sep. 24, 2020

(51) Int. Cl.
*H01L 23/538* (2006.01)
*H01L 23/00* (2006.01)
*H01L 23/498* (2006.01)
*H01L 21/48* (2006.01)
*H01L 21/52* (2006.01)
*G02B 6/12* (2006.01)

(52) U.S. Cl.
CPC ............ *H01L 23/5389* (2013.01); *G02B 6/12* (2013.01); *H01L 21/4857* (2013.01); *H01L 21/52* (2013.01); *H01L 23/49894* (2013.01); *H01L 23/5383* (2013.01); *H01L 23/5386* (2013.01); *H01L 24/08* (2013.01); *G02B 2006/12038* (2013.01); *H01L 2224/08235* (2013.01)

(58) Field of Classification Search
None
See application file for complete search history.

(56) References Cited

U.S. PATENT DOCUMENTS

| 9,087,912 B2 * | 7/2015 | Liao ................. H01L 24/10 |
| 10,180,548 B2 * | 1/2019 | Asai .................. G02B 6/4257 |
| 2009/0215231 A1 | 8/2009 | Inoue |
| 2011/0095422 A1 | 4/2011 | Hashimoto |

(Continued)

FOREIGN PATENT DOCUMENTS

| EP | 3 336 893 A1 | 6/2018 |
| EP | 3 422 398 A1 | 1/2019 |
| KR | 20140076090 A | 6/2014 |

OTHER PUBLICATIONS

Manook, R.; Partial European Search Report in Application No. 20162435.0; pp. 1-20; dated Apr. 23, 2020; European Patent Office, 80298, Munich, Germany.

(Continued)

*Primary Examiner* — Robert K Carpenter
(74) *Attorney, Agent, or Firm* — Robert A. Blaha; Smith Tempel Blaha LLC (57) ABSTRACT

An interposer-type component carrier includes a stack comprising at least one electrically conductive layer structure and at least one electrically insulating layer structure; a cavity formed in an upper portion of the stack; an active component embedded in the cavity and having at least one terminal facing upwards; and a redistribution structure having only one electrically insulating layer structure above the component. A method of manufacturing an interposer-type component carrier is also disclosed.

24 Claims, 4 Drawing Sheets

(56) References Cited

U.S. PATENT DOCUMENTS

| | | |
|---|---|---|
| 2012/0020026 A1 | 1/2012 | Oganesian et al. |
| 2014/0247561 A1 | 9/2014 | Inui |
| 2016/0233166 A1 | 8/2016 | Teh et al. |
| 2017/0256478 A1 | 9/2017 | Sakamoto et al. |
| 2017/0273195 A1 | 9/2017 | Pen |
| 2017/0316994 A1 | 11/2017 | Hoegerl et al. |
| 2018/0145033 A1 | 5/2018 | Yi et al. |

OTHER PUBLICATIONS

Manook, R.; Extended European Search Report in Application No. 20162435.0; dated Aug. 5, 2020, pp. 1-34; European Patent Office; 80298; Munich, Germany.

* cited by examiner

INTERPOSER-TYPE COMPONENT CARRIER AND METHOD OF MANUFACTURING THE SAME

TECHNICAL FIELD

The invention relates to an interposer-type component carrier and to a method of manufacturing the same.

TECHNOLOGICAL BACKGROUND

A conventional interposer-type component carrier comprises a stack having at least one electrically conductive layer structure and at least one electrically insulating layer structure, and an active component which is surface mounted with its contacts facing downwards on the stack. The term "facing downwards" means that the component is embedded in the component carrier with the contacts of the component being arranged at the bottom main surface of the component. This configuration usually requires a plurality of fan out layers.

Once the chip is embedded, many inter-metallic interfaces are built up thereon so that the component carrier can suffer on parasitic influences such as parasitic inductivities or parasitic capacities which may form an undesired resonant circuit, wherein disturbing voltage oscillations can damage semiconductor components and worsen electromagnetic compatibility and signal transmission properties. This can also lead to a loss or a decrease in signal and power integrity. In addition, the component is often a semiconductor chip which can be damaged during manufacturing of the component carrier. The described manufacturing method creates or poses a high risk for yield loss.

SUMMARY

There may be a need of an interposer-type component carrier and a method of manufacturing the same, by which the yield is improved and parasitic influences are reduced, while a sufficient fan-out is provided. This need may be met by the interposer-type component carrier and the method of manufacturing the same set forth in the independent claims.

According to an exemplary embodiment of the invention, an interposer-type component carrier is provided, the interposer-type component carrier comprising a stack having at least one electrically conductive layer structure and at least one electrically insulating layer structure; a cavity formed in an upper portion of the stack; an active component embedded in the cavity and having at least one terminal facing upwards; and a redistribution structure having only one electrically insulating layer structure above the component.

According to an exemplary embodiment of the invention, a method of manufacturing an interposer-type component carrier is provided, the method comprising providing a stack comprising at least one electrically conductive layer structure and at least one electrically insulating layer structure; forming a cavity in an upper portion of the stack; embedding an active component in the cavity so that at least one terminal of the component faces upwards; and forming a redistribution structure having only one electrically insulating layer structure above the component.

According to the invention, the active component can be embedded in the cavity at a very late stage of the manufacturing process of the interposer-type component carrier so that damage of the active component during the remainder of the manufacturing process is unlikely. Before the active component is embedded, the stack is nearly completed and optionally tested. A high yield can be obtained and material costs can be saved as the active component is embedded as late as possible and only one electrically insulating layer structure is to be arranged above the component.

In the present invention, only one redistribution structure or redistribution layer is required so that the number of inter-metallic interfaces above the active component and thus parasitic influences can be reduced. A length of line connections between an active component and a main surface of the interposer-type component carrier, where other components can be connected, can be shortened.

OVERVIEW OF EMBODIMENTS

In the context of the present application, the term "only one electrically insulating layer structure above the component" can either mean exactly one or several individual but contiguous layers (of same or different materials) consecutively applied atop each other. The only one electrically insulating layer structure above the component can have a plurality of internal routing layers which are formed by several (thin) layers of an electrically conductive material, wherein these routing layers can have different densities.

In addition, the present invention enables a simple creation of the required cavity so that different cavity depths are possible.

It is possible that the active component has a plurality of terminals, wherein all terminals thereof are facing upwards.

In the following, further exemplary embodiments of the present invention will be explained.

According to an exemplary embodiment of the interposer-type component carrier, the terminal is an electrically conductive pad and the redistribution structure comprises an electrically conductive connection of the pad up to an exterior surface of the component carrier.

According to an exemplary embodiment of the interposer-type component carrier, the terminal is an optical terminal and the redistribution structure comprises at least one lightguide extending up to an exterior surface of the component carrier. The lightguide can be a glass fiber which is embedded in the redistribution structure, or the lightguide can be part of the only one electrically insulating layer structure above the component. The lightguide can by formed by altering an index of refraction in parts of the only one electrically insulating layer structure above the component.

According to an exemplary embodiment of the interposer-type component carrier, the active component is a semiconductor chip, in particular at least one of a memory chip, a controller chip, a microprocessor chip, a transmitter chip, and a receiver chip.

According to an exemplary embodiment of the interposer-type component carrier, the interposer-type component carrier comprises a layer or block of thermally highly conductive material, in particular a copper layer or a copper block, in the cavity below the active component. The layer or the block of the thermally highly conductive material promotes heat dissipation from the active component.

According to an exemplary embodiment of the interposer-type component carrier, the interposer-type component carrier comprises a further cavity in which a further active component is embedded, wherein in particular the active component is interactively connected with the further active component, more particularly through the at least one electrically conductive layer structure.

According to an exemplary embodiment of the interposer-type component carrier, the active component and the further active component have different heights. The different heights can readily be created when forming the cavities in the stack.

According to an exemplary embodiment of the interposer-type component carrier, the only one electrically insulating layer structure of the redistribution structure comprises or consists of a photo-imageable dielectric (PID). The PID enables very fine, high-density fan-out layers, for example by a dual damascene process. The PID further reduces thermal and mechanical stresses to the stack and the active component.

According to an exemplary embodiment of the interposer-type component carrier, the only one electrically insulating layer structure of the redistribution structure is liquid, powdery or a dry film.

According to an exemplary embodiment of the interposer-type component carrier, the only one electrically insulating layer structure of the redistribution structure is patterned by a lithographic process or another photo process or plasma etching, imprinting, laser grooving or dry etching.

According to an exemplary embodiment of the interposer-type component carrier, the interposer-type component carrier comprises an electrically insulating solder resist on a part of an upper main surface of the component carrier.

According to an exemplary embodiment of the interposer-type component carrier, at least one of the active component, the cavities and the stack are known good. The meaning of the term "known good" can include previously successfully tested active components, cavities and/or stacks, i.e. at least one of the active component, the cavity and the stack successfully passed a previous test. Thereby, a high yield can be obtained and material costs can be saved. However, a test is not always obligatory if the active component, the cavity and/or the stack are known to be good for other reasons. For example, the active component, the cavity and/or the stack can be known to be good when their manufacturing processes have a certain (quality) standard or their reject rate in the manufacturing process is generally lower than a certain limit.

According to an exemplary embodiment of the invention, the interposer-type component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

According to an exemplary embodiment of the method, the terminal is an electrically conductive pad and the redistribution structure comprises an electrically conductive connection of the pad up to an exterior surface of the component carrier.

According to an exemplary embodiment of the method, the terminal is an optical terminal and the redistribution structure comprises at least one lightguide extending up to an exterior surface of the component carrier.

According to an exemplary embodiment of the method, the active component is a semiconductor chip, in particular at least one of a memory chip, a controller chip, a microprocessor chip, a transmitter chip, and a receiver chip.

According to an exemplary embodiment, the method comprises applying a layer or inserting a block of thermally highly conductive material, in particular a copper layer or a copper block, in the cavity before embedding the active component in the cavity.

According to an exemplary embodiment, the method comprises embedding a further active component in a further cavity of the interposer-type component carrier, wherein in particular the active component is interactively connected with the further active component, more particularly through the at least one electrically conductive layer structure.

According to an exemplary embodiment of the method, the active component and the further active component have different heights.

According to an exemplary embodiment of the method, the only electrically insulating layer structure of the redistribution structure comprises or consists of a photo-imageable dielectric.

According to an exemplary embodiment of the method, the only electrically insulating layer structure of the redistribution structure is liquid, powdery or a dry film.

According to an exemplary embodiment of the method, the only electrically insulating layer structure of the redistribution structure is patterned by a lithographic process or another photo process, plasma etching, imprinting, laser grooving or dry etching.

According to an exemplary embodiment, the method comprises applying an electrically insulating solder resist on a part of an upper main surface of the component carrier.

According to an exemplary embodiment of the method, only known-good active components are embedded in known-good cavities of a known-good stack.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (commonly known by the brand name Teflon® a registered trademark of the Chemours Company FC, LLC of Delaware, U.S.A.), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with a supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

DETAILED DESCRIPTION OF ILLUSTRATED EMBODIMENTS

The aspects defined above and further aspects of the invention are apparent from the examples of embodiment to be described hereinafter and are explained with reference to these examples of embodiment.

The illustrations in the drawings are schematically presented. In different drawings, similar or identical elements or features are provided with the same reference signs.

Figure 1:
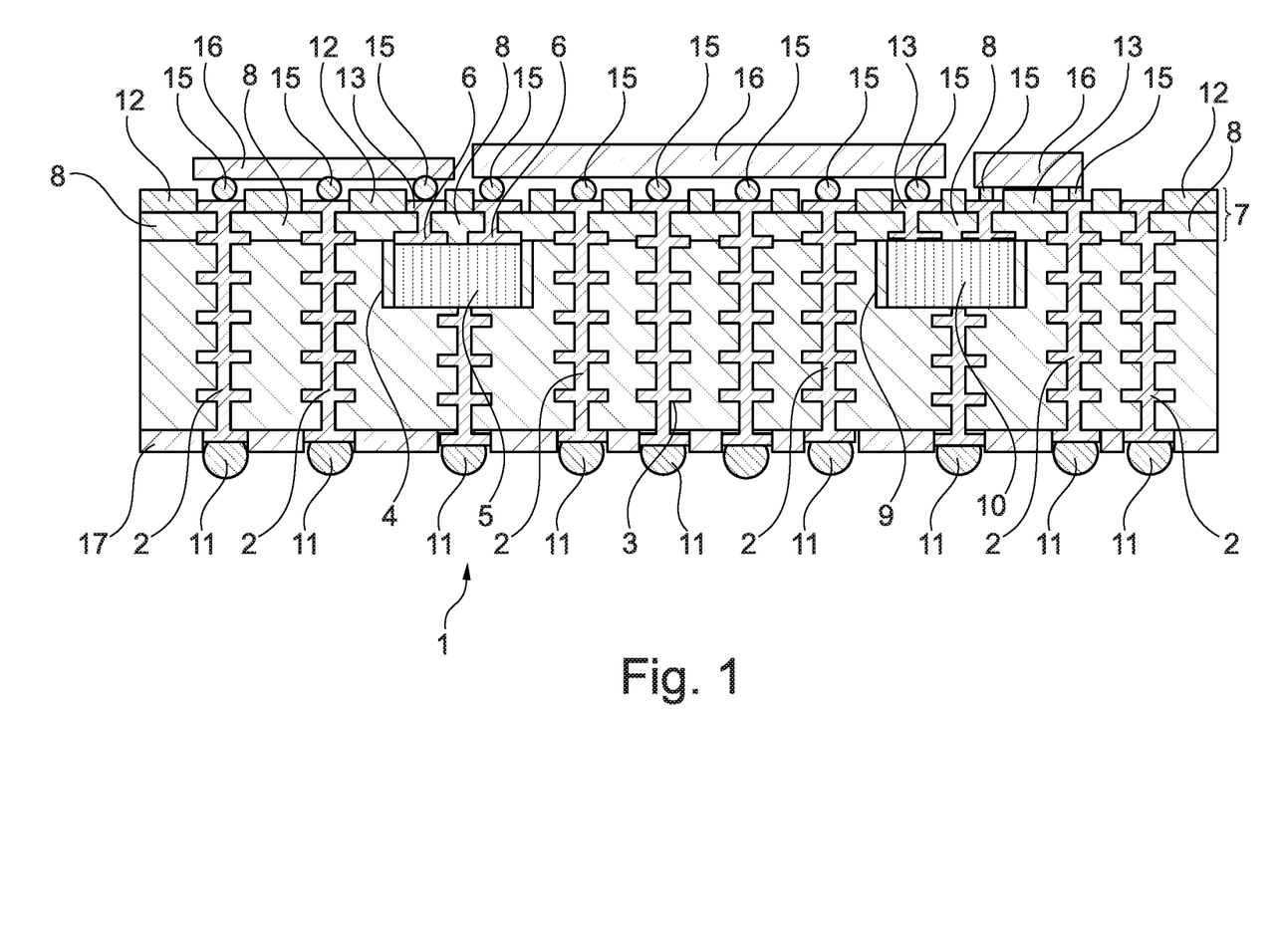
FIG. 1 illustrates a cross-sectional view of an interposer-type component carrier according to an exemplary embodiment of the invention.

FIG. 1 illustrates a cross-sectional view of an interposer-type component carrier 1 according to an exemplary embodiment of the invention. The interposer-type component carrier 1 can be shaped as a plate.

The interposer-type component carrier comprises a stack having electrically conductive layer structures 2 and an electrically insulating layer structure 3.

The electrically conductive layer structures 2 of the component carrier can comprise at least one of the group consisting of copper, aluminum, nickel, silver, gold, palladium, and tungsten, any of the mentioned materials being optionally coated with a supra-conductive material such as graphene.

The electrically insulating layer structure 3 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

A cavity 4 is formed in an upper portion of the stack.

An active component 5 is embedded in the cavity 4 and has terminals 6 facing upwards. The active component 5 can be a semiconductor chip, in particular at least one of a memory chip, a controller chip, a microprocessor chip, a transmitter chip, and a receiver chip.

The interposer-type component carrier 1 comprises a redistribution structure 7. The redistribution structure 7 is formed as a redistribution layer which is connected to the terminals 6 of the active component 5 having a smaller density and comprises an upper electrically conductive layer structure 13 having a higher density. The upper electrically conductive layer structure 13 can form a first level interconnection (i.e. a die connection and a fan out).

Solder balls 11 at the bottom main surface of the interposer-type component carrier 1 are connected to a respective electrically conductive layer structure 2 and form end terminals of the interposer-type component carrier 1 having the smaller density. The upper electrically conductive layer structure 13 forms terminals or solder pads with the larger density, which can be connected to terminals 15 of other dies or other components 16.

The redistribution structure 7 comprises only one electrically insulating layer structure 8 above the component 5. The only electrically insulating layer structure 8 of the redistribution structure 7 comprises or consists of a photo-imageable dielectric.

The only electrically insulating layer structure 8 of the redistribution structure 7 can be obtained by a patterning process such as a lithographic process or another photo process, plasma etching, imprinting, laser grooving or dry etching.

The only electrically insulating layer structure 8 of the redistribution structure 7 can alternatively be liquid, powdery or a dry film.

In the embodiment, the terminals 6 are electrically conductive pads and the redistribution structure 7 comprises an electrically conductive connection of the pads 6 up to an exterior surface of the component carrier 1. In a modified embodiment, the terminal 6 of the component 5 can be an optical terminal and the redistribution structure 7 can comprise at least one lightguide extending up to an exterior surface of the component carrier 1.

The interposer-type component carrier 1 further comprises a further cavity 9 in which a further active component 10 is embedded, wherein in particular the active component 5 is interactively connected with the further active component 10, more particularly through the at least one electrically conductive layer structure 2 and/or the upper electrically conductive layer structure 13. The active component 5 and the further active component 10 can have different heights. The depths of the cavities 4 and 9 can be adapted to the different heights of the active component 5 and the further active component 10. Upper main surfaces of the active component 5 and the further active component 10 can be aligned to the same level.

The interposer-type component carrier 1 comprises an electrically insulating solder resist 12 on a part of an upper main surface of the component carrier 1.

A finish 17, for example an electrically insulating solder resist, is applied to the bottom main surface of the component carrier 1.

In order to enhance the yield of manufacturing of the interposer-type component carrier 1, only known good active components are embedded in known good cavities of known good stack. The meaning of the term "known-good" can include previously successfully tested active components, cavities and/or stacks. That means, at least one of the active components 5, 10, the cavities 4, 9 and/or the stack has successfully passed a test. However, a test is not obligatory because the active component, the cavity and/or the stack can be known to be good for other reasons. For example, the active component, the cavity and/or the stack can be known to be good when their manufacturing processes have a certain (quality) standard or a reject rate is generally lower than a certain limit.

In a modified embodiment, the interposer-type component carrier 1 can comprise a block of thermally highly conductive material, in particular a copper block, in the cavity 4 below the active component 5 so that the heat dissipation from the active component 5 is promoted.

The interposer-type component carrier 1 can further comprise an additional component (not shown) which is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

Figure 2:
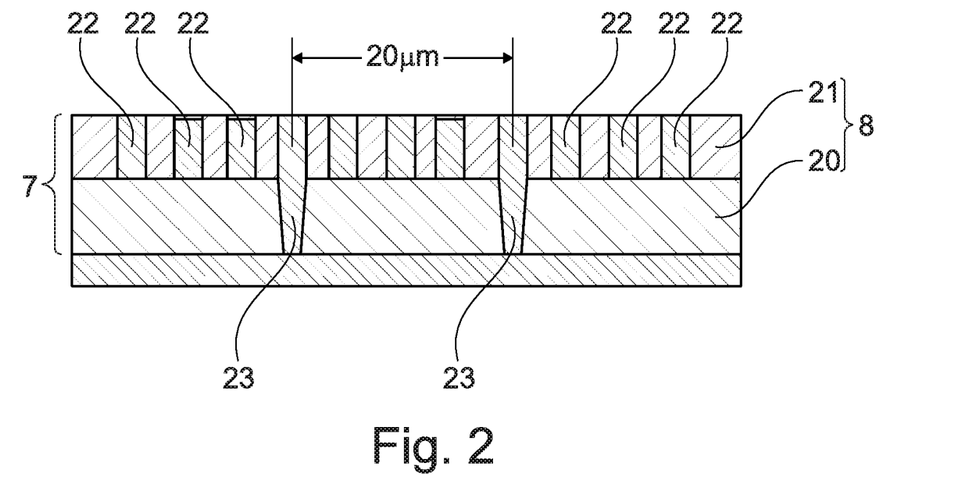
FIG. 2 illustrates a redistribution structure of an interposer-type component carrier according to an exemplary embodiment of the invention.

FIG. 2 illustrates a redistribution structure 7 of an interposer-type component carrier 1 according to an exemplary embodiment of the invention. In the embodiment, the redistribution structure 7 comprises microvias 23 with a high density, for example with a distance of 20 µm between adjacent microvias 23. The redistribution structure 7 with such a high I/O density can be manufactured by a so called via-in-trench (ViT) technology, in particular by a dual damascene process. In an embodiment, the dual damascene process can have the following steps:

In a first step, an inter-level dielectric (ILD) 20 can be applied to the stack.

In a second step, an etch stop layer (not shown) is applied to the inter-level dielectric 20.

In a third step, an inter-metal dielectric (IMD) 21 is applied to the etch stop layer.

In a fourth step, a photoresist is applied to the inter-metal dielectric 21 and structured by a lithography process or another photo process, plasma etching, imprinting, laser grooving or dry etching.

In a fifth step, the inter-metal dielectric 21 is etched to form trenches 22.

In a sixth step, the photoresist is removed or stripped.

In a seventh step, another photoresist is applied to the inter-metal dielectric 21 and the etch stop layer, and this photoresist is structured by a lithography process or another photo process, plasma etching, imprinting, laser grooving or dry etching.

In an eighth step, the etch stop layer and the inter-level dielectric 20 are etched to form vias (microvias) 23.

In a ninth step, the other photoresist is removed or stripped. In addition, a cleaning step can be performed, and a hydrophobic coating (e.g. for Cu Migration) and/or a diffusion barrier, for example a tantalum-based layer (Ta), can be applied to the trenches 22 and the vias 23.

In a tenth step, a metal is filled in the trenches 22 and the vias 23, for example by copper electroplating. Before that, a copper seed layer can optionally be deposited by physical vapor deposition (PVD). After the copper electroplating step, an excess of the copper can be removed, for example by a chemical mechanical polishing process (CMP). At the end, a finish (not shown) can be applied to the inter-metal dielectric 21 and the trenches 22.

In this embodiment of the dual damascene process, the vias 23 are formed after the trenches 22, i.e. the vias 23 are arranged underneath the trenches 22. The embodiment can be modified in that the vias 23 are formed before the trenches 22, i.e. the trenches 22 are arranged underneath the vias 23, for example by interchanging the inter-level dielectric (ILD) and the inter-metal dielectric (IMD).

In any case, the redistribution structure 7 comprises the trenches 22 and the vias 23.

In the embodiment of the dual damascene process, the inter-level dielectric (ILD) 20 and the inter-metal dielectric (IMD) 21 are contiguous, amongst others by the interconnected vias 23 and trenches 22, so that the inter-level dielectric (ILD) 20 and the inter-metal dielectric (IMD) 21 form together the only one electrically insulating layer structure 8 of the redistribution structure 7 in the meaning of the present invention.

Figure 3:
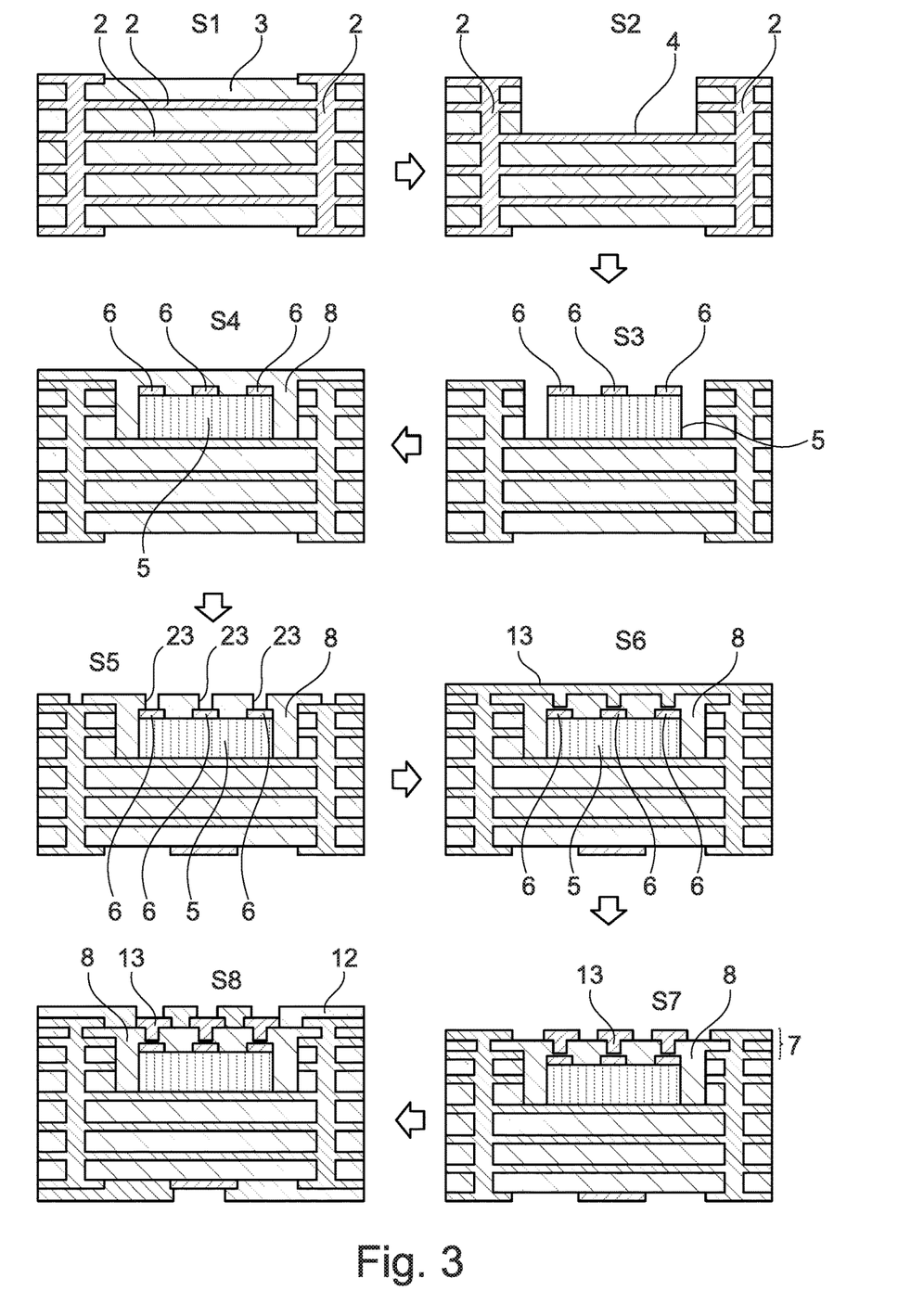
FIG. 3 illustrates a method of manufacturing an interposer-type component carrier according to an exemplary embodiment of the invention.

FIG. 3 illustrates a method of manufacturing an interposer-type component carrier 1 according to an exemplary embodiment of the invention.

In a step S1, a stack is formed comprising electrically conductive layer structures 2 and an electrically insulating layer structure 3. The stack can be formed by conventional PCB processes. The stack can be coreless stack, and the stack can be symmetrically or asymmetrically built up.

It is to be noted that, even though the electrically conductive layer structures 2 are schematically depicted in FIG. 3 as straight interconnected lines, the present invention is not limited thereto. The electrically conductive layer structures 2 can assume any (partially) patterned conductive layer shapes.

In a step S2, a cavity 4 is formed in an upper portion of the stack. For example, the cavity 4 can be formed by mechanical drilling, etching and/or laser drilling. For example, the electrically conductive layer structures 2 can first be roughened or blackened by an UV laser, wherein the roughened or blackened parts are subsequently removed by a $CO_2$ laser. Parts of the electrically conductive layer structures 2 and/or the electrically insulating layer structure 3 are thus removed to form the cavity 4. In addition, it is possible to refill a part of the cavity 4 by an electrically insulating material. For example, a gap between a cavity bottom and a component can be filled with an extra dielectric material using e.g. inkjet or dispenser. Alternatively, a dielectric layer of a next build-up layer can be used to fill the gap.

Optionally (not shown in drawings), the bottom of the cavity 4 can be covered with a copper layer to support the thermal management for a component that is placed and embedded in the cavity 4. This copper layer can be exposed during forming the cavity 4. This copper layer can be provided in addition or as an alternative to the above described thermally highly conductive material, which is in particular a copper block.

In a step S3, an active component 5 is embedded in the cavity 4, wherein the active component 5 has terminals 6 facing upwards. The active component 5 can be a semiconductor chip, in particular at least one of a memory chip, a controller chip, a microprocessor chip, a transmitter chip, and a receiver chip.

Before embedding the active component 5 in the cavity 4, a block of a thermally highly conductive material, in particular a copper block, can optionally be placed in the cavity 4 below the active component 5.

In a step S4, an electrically insulating material is filled in the cavity 4 to form the electrically insulating layer structure 8 above the component 5. The electrically insulating material can optionally be filled at side surfaces of the component 5 and on the remaining upper surface of the stack. The electrically insulating layer structure 8 can comprise a PID (photo-imageable dielectric) material, or alternatively a liquid or powdery material or a dry film.

In a step S5, vias 23 corresponding to the terminals 6 of the active component 5 are formed in the electrically insulating layer structure 8. Optionally, trenches (not shown) can also be formed in the electrically insulating layer structure 8. Thereby, the only electrically insulating layer structure of the redistribution structure 8 is patterned, which can be done by a lithographic process or another photo process, plasma etching, imprinting, laser grooving or dry etching. In particular if another component is connected to the component carrier 1 by a flip-chip connection, photovias 23 have benefits of a high registration, lower costs and less thermal damage of the component.

In a step S6, the vias 23 and optionally the trenches are filled or plated by an electrically conductive material such as copper to form a preform of an upper electrically conductive layer structure 13. Before the electroplating process, a thin copper seed layer can optionally be deposited by physical vapor deposition (PVD).

In a step S7, the upper electrically conductive layer structure 13 is patterned or structured by conventional lithography and etching processes.

In a step S8, an electrically insulating solder resist 12 is applied to a part of an upper main surface, here on the upper electrically conductive layer structure 13, of the thus manufactured component carrier 1.

Alternatively, a dual damascene process similar to FIG. 2 can be carried out in the steps S4 to S7 of FIG. 3 to form the redistribution structure 7.

In a modified embodiment, a further cavity can be formed in step S2, in which a further active component is embedded in step S3. The active component 5 can interactively be connected with the further active component, more particularly through the at least one electrically conductive layer structure 2 or through the upper electrically conductive layer structure 13 of the redistribution structure 7. Furthermore, the active component 5 and the further active component can have different heights. Accordingly, different depths of the cavity 4 and the further cavity can readily be created in step S2.

Figure 4:
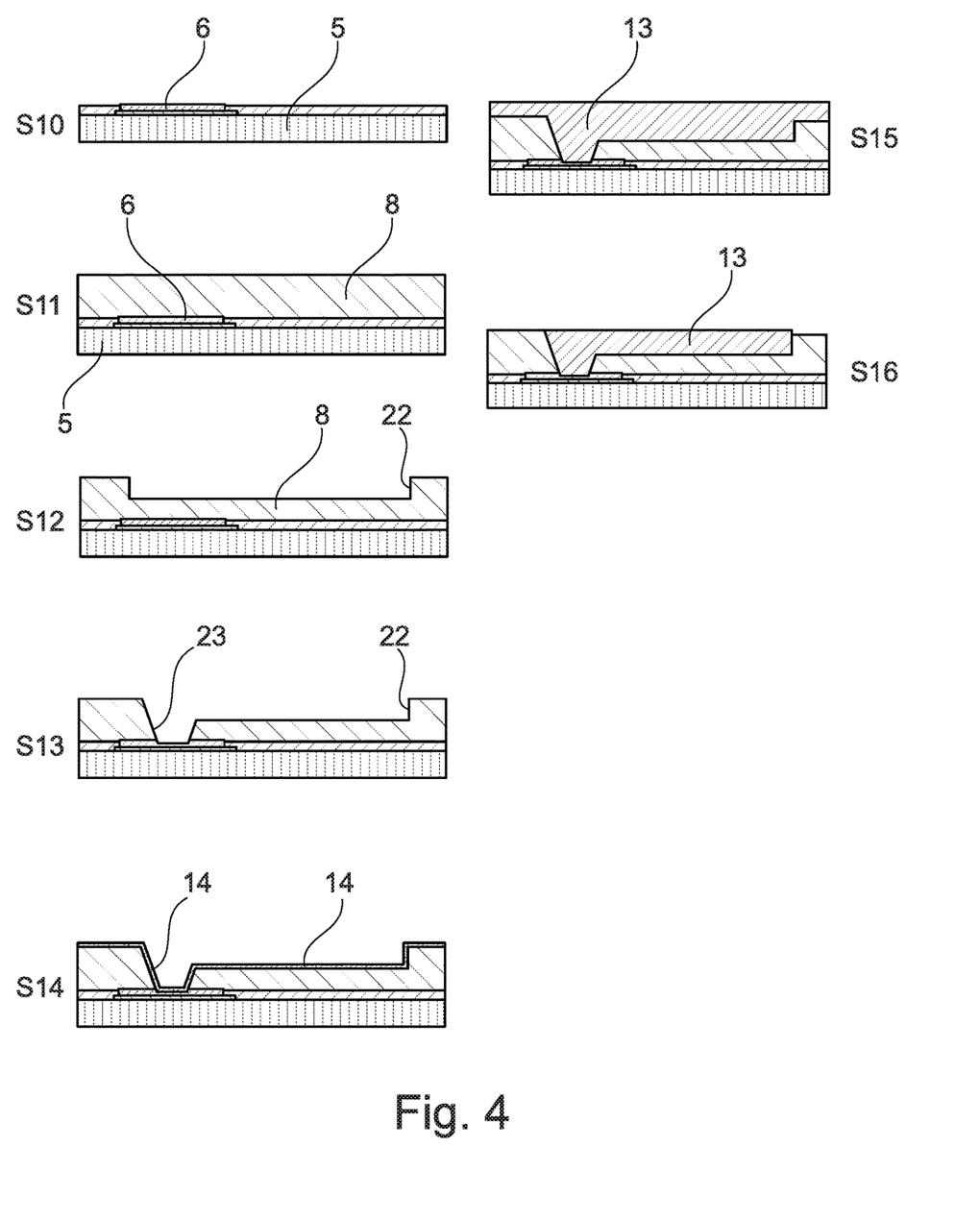
FIG. 4 illustrates a method of manufacturing a redistribution structure of an interposer-type component carrier according to an exemplary embodiment of the invention.

FIG. 4 illustrates a method of manufacturing a redistribution structure 7 of an interposer-type component carrier 1 according to another exemplary embodiment of the invention.

Step S10 shows the initial situation where the component 5 having the terminal 6 faced upwards is placed in the cavity 4 of the component carrier 1 (see FIG. 1).

In a step S11, an electrically insulating layer structure 8 is formed in the cavity 4 above the component 5 (see also FIG. 1). The electrically insulating layer structure 8 can comprise a PID (photo-imageable dielectric) material, or a liquid or powdery material or a dry film.

In a step S12, a lithography or another photo process, plasma etching, imprinting, laser grooving or dry etching is carried out to form a trench 22 in the electrically insulating layer structure 8.

In a step S13, a lithography or another photo process, plasma etching, imprinting, laser grooving or dry etching is carried out to form a via 23 in the electrically insulating layer structure 8, wherein the via 23 is underneath the trench 22. Alternatively, the trench 22 can be formed underneath the via 23.

In a step S14, a seed layer 14 is applied on the electrically insulating layer structure 8, i.e. in the trench 22 and the via 23, for example by physical vapor deposition (PVD).

In a step S15, a metal such as copper is applied to the seed layer 14 in the trenches 22 and the vias 23, for example by copper electroplating.

In a step S16, an excess of the copper can be removed, for example by a chemical mechanical polishing process (CMP). Eventually, a finish (not shown), for example an electrically insulating solder resist, can be applied to the polished metal surface.

The methods shown in FIGS. 3 and 4 can be carried out in that only known good active components 5 are embedded in cavities 4 of a stack. The meaning of the term "known good" can include previously successfully tested active components, cavities and/or stacks. Thus, a step of testing the active component 5 can be carried out before embedding the same in the cavity 4. In addition, a step of testing the cavity 4 can optionally be carried out before embedding the active component 5 therein. In addition, a step of testing the stack can optionally be carried out before forming the cavity 4 or before embedding the active component 5 therein.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. An interposer component carrier, comprising:
   a stack comprising at least one electrically conductive layer structure and at least one electrically insulating layer structure;
   a cavity formed in an upper portion of the stack;
   an active component embedded in the cavity and having terminals lacing upwards; and
   a redistribution structure comprising:
      exactly one further electrically insulating layer structure above the active component, the further electrically insulating layer structure having an upper surface and a lower surface;
      vias connecting the terminals of the active component and passing through the further electrically insulating layer from the upper surface to the lower surface, the vias having a first distance between each other; and
      trenches arranged at the upper surface of the further electrically insulating layer structure above the active component and being filled by metal, the trenches having a second distance between each other, the second distance being smaller than the first distance.

2. The interposer component carrier according to claim 1, wherein the terminals are electrically conductive pads and the redistribution structure comprises an electrically conductive connection of at least one of the electrically conductive pads to an exterior surface of the component carrier.

3. The interposer component carrier according to claim 1, wherein the terminals are optical terminals and the redistribution structure comprises at least one lightguide extending up to an exterior surface of the component carrier.

4. The interposer component carrier according to claim 1, wherein the active component is at least one of a memory chip, a controller chip, a microprocessor chip, a transmitter chip, and a receiver chip.

5. The interposer component carrier according to claim 1, further comprising:
   a layer or block of thermally conductive material in the cavity below the active component.

6. The interposer component carrier according to claim 1, further comprising:
   a further cavity in which a further active component is embedded, wherein the active component is interactively connected with the further active component through the at least one electrically conductive layer structure.

7. The interposer component carrier according to claim 6, wherein the active component and the further active component have different heights.

8. The interposer component carrier according to claim 1, wherein the further electrically insulating layer structure of the redistribution structure comprises a photo-imageable dielectric.

9. The interposer component carrier according to claim 1, wherein the further electrically insulating layer structure of the redistribution structure is liquid, powdery or a dry film.

10. The interposer component carrier according to claim 1, wherein the further electrically insulating layer structure of the redistribution structure is patterned by a lithographic process or another photo process, plasma etching, imprinting, laser grooving or dry etching.

11. The interposer component carrier according to claim 1, further comprising:
an electrically insulating solder resist on a part of an upper main surface of the component carrier.

12. The interposer component carrier according to claim 1,
wherein the exactly one further electrically insulating layer structure comprises a first inter-metal dielectric layer and a second inter-metal dielectric layer on top of the first inter-metal dielectric layer;
wherein the vias pass through the first and second inter-metal dielectric layers; and
wherein the trenches are arranged in the second inter-metal dielectric layer.

13. The interposer component carrier according to claim 1, comprising at least one of the following features:
at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein the at least one electrically conductive layer structure of the component carrier comprises at least one of the group consisting of copper, aluminum, nickel, silver, gold, palladium, and tungsten, any of the mentioned materials coated with graphene;
wherein the electrically insulating layer structure comprises at least one of the group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, polyimide, polybenzoxazole, benzocyclobutene, and a metal oxide;
wherein the component carrier is shaped as a plate;
wherein the component carrier is configured as one of the group consisting of a printed circuit board, and a substrate;
wherein the component carrier is configured as a laminate component carrier.

14. A method of manufacturing an interposer component carrier, the method comprising:
providing a stack comprising at least one electrically conductive layer structure and at least one electrically insulating layer structure;
forming a cavity in an upper portion of the stack;
embedding an active component in the cavity so that terminals of the component face upwards; and
forming a redistribution structure by:
forming exactly one further electrically insulating layer structure above the active component, the further electrically insulating layer structure having an upper surface and a lower surface;
forming vias connecting the terminals of the active component and passing through the further electrically insulating layer between the upper and lower surface, the vias a first distance between each other;
forming trenches at the upper surface of the further electrically insulating layer structure above the active component and filling the trenches by metal, the trenches having a second distance between each other, the second distance being smaller than the first distance.

15. The method according to claim 14, wherein the terminals are electrically conductive pads and the redistribution structure comprises an electrically conductive connection of at least one of the electrically conductive pads to an exterior surface of the component carrier.

16. The method according to claim 14, wherein the terminals are optical terminals and the redistribution structure comprises at least one lightguide extending up to an exterior surface of the component carrier.

17. The method according to claim 14, wherein the active component is one of a memory chip, a controller chip, a microprocessor chip, a transmitter chip, and a receiver chip.

18. The method according to claim 14, further comprising:
applying a layer or inserting a block of thermally conductive material in the cavity before embedding the active component in the cavity.

19. The method according to claim 14, further comprising:
embedding a further active component in a further cavity of the interposer component carrier, wherein the active component is interactively connected with the further active component through the at least one electrically conductive layer structure.

20. The method according to claim 19, wherein the active component and the further active component have different heights.

21. The method according to claim 14, wherein the further electrically insulating layer structure of the redistribution structure comprises a photo-imageable dielectric.

22. The method according to claim 14, wherein the further electrically insulating layer structure of the redistribution structure is liquid, powdery or a dry film.

23. The method according to claim 14,
wherein the further electrically insulating layer structure of the redistribution structure is patterned by a lithographic process or another photo process, plasma etching, imprinting, laser grooving or dry etching.

24. The method according to claim 14, further comprising:
applying an electrically insulating solder resist on a part of an upper main surface of the component carrier.

* * * * *